(12) United States Patent
Ghyselen

(10) Patent No.: US 11,935,743 B2
(45) Date of Patent: Mar. 19, 2024

(54) METHOD FOR MANUFACTURING A MONOCRYSTALLINE LAYER OF DIAMOND OR IRIDIUM MATERIAL AND SUBSTRATE FOR EPITAXIALLY GROWING A MONOCRYSTALLINE LAYER OF DIAMOND OR IRIDIUM MATERIAL

(71) Applicant: Soitec, Bernin (FR)

(72) Inventor: Bruno Ghyselen, Seyssinet (FR)

(73) Assignee: SOITEC, Bernin (FR)

( * ) Notice: Subject to any disclaimer, the term of this patent is extended or adjusted under 35 U.S.C. 154(b) by 687 days.

(21) Appl. No.: 17/042,728

(22) PCT Filed: Mar. 26, 2019

(86) PCT No.: PCT/IB2019/000196
§ 371 (c)(1),
(2) Date: Sep. 28, 2020

(87) PCT Pub. No.: WO2019/186262
PCT Pub. Date: Oct. 3, 2019

(65) Prior Publication Data
US 2021/0020434 A1    Jan. 21, 2021

(30) Foreign Application Priority Data
Mar. 28, 2018  (FR) ...................................... 1800255

(51) Int. Cl.
*H01L 21/02*   (2006.01)
*C30B 23/02*   (2006.01)
(Continued)

(52) U.S. Cl.
CPC ...... *H01L 21/02293* (2013.01); *C30B 23/025* (2013.01); *C30B 25/183* (2013.01); *C30B 29/04* (2013.01); *C30B 29/06* (2013.01)

(58) Field of Classification Search
CPC .. C30B 29/04; C30B 23/025; H01L 21/02293
See application file for complete search history.

(56) References Cited

U.S. PATENT DOCUMENTS

2011/0171812 A1   7/2011   Letertre et al.
2015/0041853 A1   2/2015   Cheng et al.

FOREIGN PATENT DOCUMENTS

CN    107268076 A    10/2017
JP    2004-217484 A    8/2004
(Continued)

OTHER PUBLICATIONS

Bauer et al. "Growth of epitaxial diamond on silicon via iridium/SrTiO3 buffer layers" Diamond and Related Materials, vol. 14, Issues 3-7 2005, pp. 314-317, ISSN 0925-9635, https://doi.org/10.1016/j.diamond.2004.10.028. (Year: 2005).*
(Continued)

*Primary Examiner* — John A Bodnar
(74) *Attorney, Agent, or Firm* — TraskBritt

(57) ABSTRACT

A process for producing a monocrystalline layer of diamond or iridium material comprises transferring a monocrystalline seed layer of SrTiO3 material onto a carrier substrate of silicon material, followed by epitaxial growth of the monocrystalline layer of diamond or iridium material.

18 Claims, 5 Drawing Sheets

(51) Int. Cl.
*C30B 25/18* (2006.01)
*C30B 29/04* (2006.01)
*C30B 29/06* (2006.01)

(56) References Cited

FOREIGN PATENT DOCUMENTS

| | | |
|---|---|---|
| JP | 2017-034220 A | 2/2017 |
| JP | 2002-124125 A | 8/2020 |

OTHER PUBLICATIONS

Bauer et al., Growth of Epitaxial Diamond on Silicon via Iridium/SrTiO3 Buffer Layers, Diamond & Related Materials, vol. 14, (2005, pp. 314-317.
International Search Report for International Application No. PCT/IB2019/000196 dated Jul. 26, 2019, 3 pages.
International Written Opinion for International Application No. PCT/IB2019/000196 dated Jul. 26, 2019, 7 pages.
Schreck et al., Diamond/IR/SrTiO3: A Material Combination for Improved Heteroepitaxial Diamond Films, Appl. Phys. Lett., vol. 74, 1999, (abstract only).
Singapore Written Opinion from Singapore Application No. 11202009528Q, dated Oct. 21, 2021, 5 pages.
Japanese Notice of Reasons for Rejection for Application No. 2020-549793 dated Feb. 21, 2023, 4 pages.
Singapore Written Opinion for Application No. 11202009528Q dated Jan. 5, 2023, 8 pages.
Chinese Frist Notification of Office Action for Application No. 201980021528.8 dated Feb. 16, 2022, 13 pages.
Chinese 2nd Office Action for Application No. 201980021528.8 dated Jul. 22, 2022, 9 pages.
Chinese Decision of Rejection for Application No. 201980021528.8 dated Oct. 17, 2022, 6 pages.

\* cited by examiner

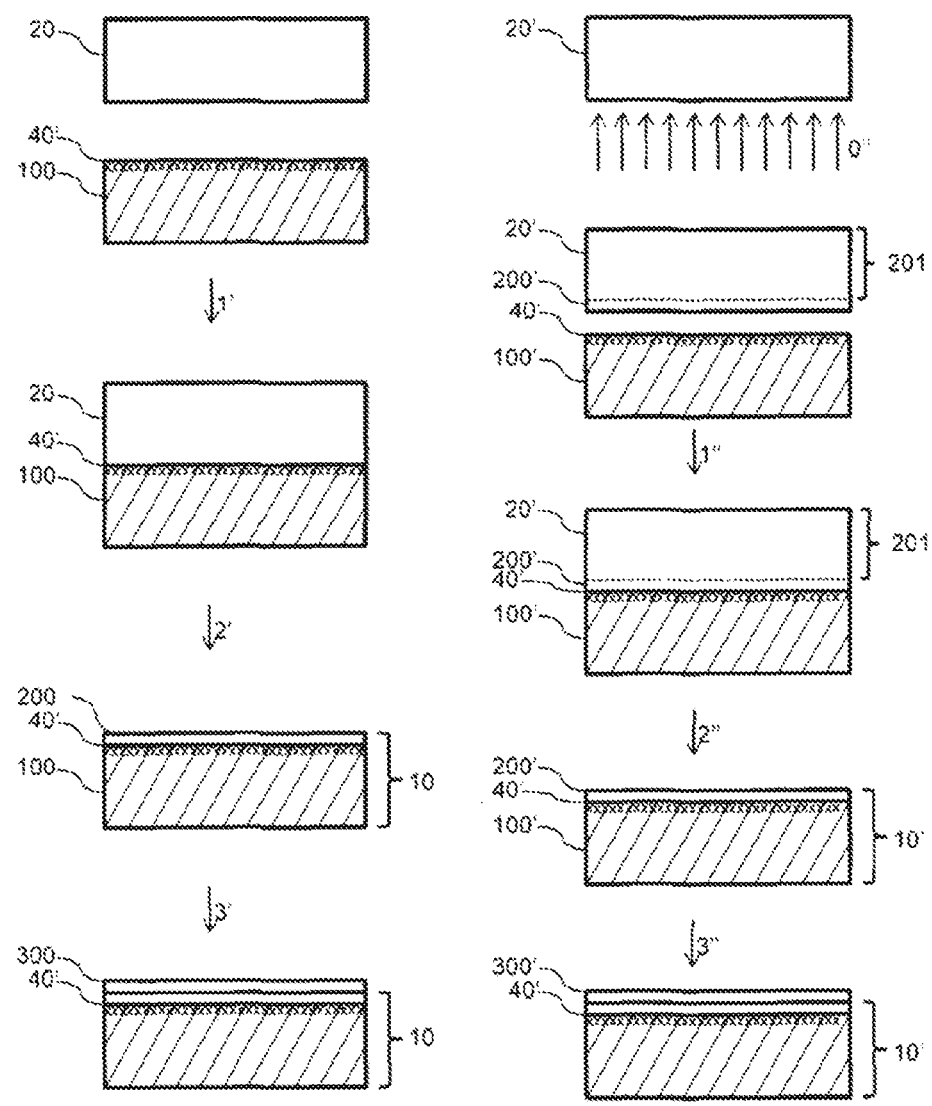

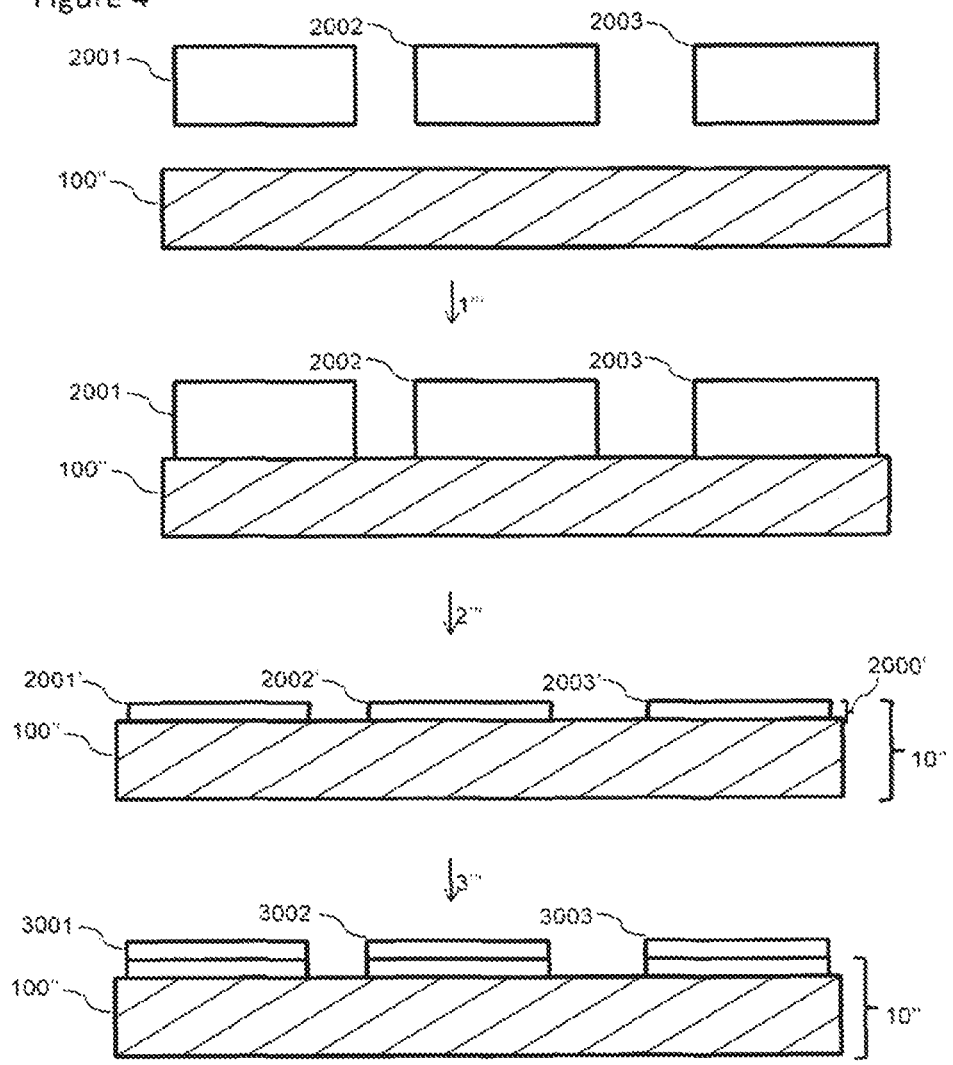

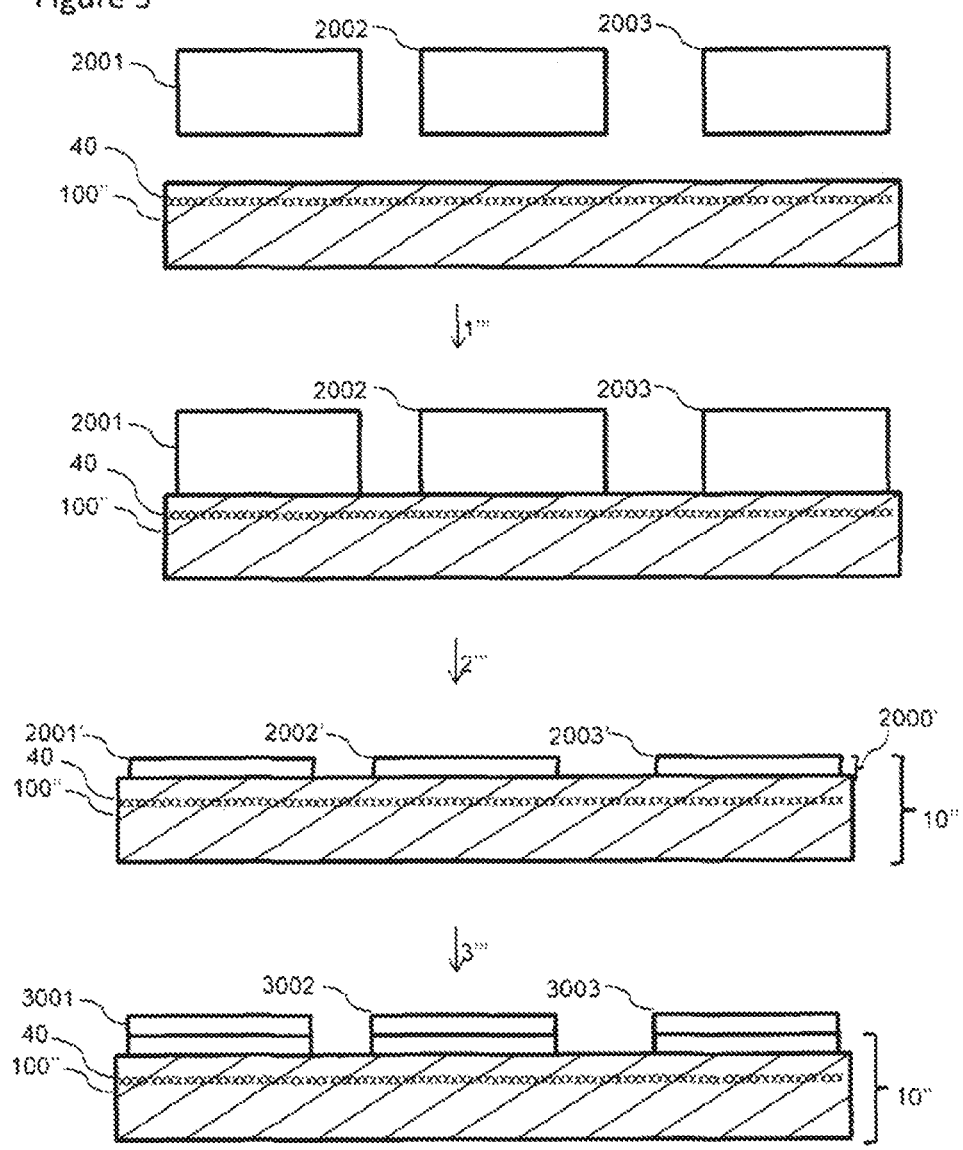

METHOD FOR MANUFACTURING A MONOCRYSTALLINE LAYER OF DIAMOND OR IRIDIUM MATERIAL AND SUBSTRATE FOR EPITAXIALLY GROWING A MONOCRYSTALLINE LAYER OF DIAMOND OR IRIDIUM MATERIAL

CROSS-REFERENCE TO RELATED APPLICATIONS

This application is a national phase entry under 35 U.S.C. § 371 of International Patent Application PCT/IB32019/000196, filed Mar. 26, 2019, designating the United States of America and published as International Patent Publication WO 2019/186262 A1 on Oct. 3, 2019, which claims the benefit under Article 8 of the Patent Cooperation Treaty to French Patent Application Serial No. 1800255, filed Mar. 28, 2018.

TECHNICAL FIELD

The present disclosure relates to a process for producing a monocrystalline layer of diamond or iridium material and a substrate for the epitaxial growth of such a monocrystalline layer of diamond or iridium material.

BACKGROUND

Certain materials are not currently available as a monocrystalline substrate in the form of a large-diameter wafer. Moreover, certain materials may be available in large diameter but not with certain characteristics or specifications in terms of quality, in particular with regard to the density of defects or the required electrical or optical properties.

BRIEF SUMMARY

The present disclosure aims to overcome these limitations of the prior art by providing a process for producing a monocrystalline layer of diamond material and a substrate for the epitaxial growth of such a monocrystalline layer of diamond material. In this way it is possible to address the problem of the size of the monocrystalline substrates of diamond material currently available.

The present disclosure relates to a process for producing a monocrystalline layer of diamond material comprising the transfer of a monocrystalline seed layer of $SrTiO_3$ material to a carrier substrate of silicon material followed by epitaxial growth of the monocrystalline layer of diamond material.

In advantageous embodiments, the monocrystalline seed layer has a thickness of less than 10 µm, preferably less than 2 µm, and more preferably less than 0.2 µm.

In advantageous embodiments, the transfer of the monocrystalline seed layer of $SrTiO_3$ material to the carrier substrate of silicon material comprises a step of joining a monocrystalline substrate of $SrTiO_3$ material to the carrier substrate followed by a step of thinning of the monocrystalline substrate of $SrTiO_3$ material.

In advantageous embodiments, the thinning step comprises the formation of a weakened zone delimiting a portion of the monocrystalline substrate of $SrTiO_3$ material intended to be transferred to the carrier substrate of silicon material.

In advantageous embodiments, the formation of the weakened zone is obtained by implanting atomic and/or ionic species.

In advantageous embodiments, the thinning step comprises detaching at the weakened zone so as to transfer the portion of the monocrystalline substrate of $SrTiO_3$ material to the carrier substrate of silicon material, in particular the detaching comprises the application of thermal and/or mechanical stress.

In advantageous embodiments, the joining step is a molecular adhesion step.

In advantageous embodiments, the monocrystalline seed layer of $SrTiO_3$ material is in the form of a plurality of tiles each transferred to the carrier substrate of silicon material.

In advantageous embodiments, the carrier substrate of silicon material comprises a detachable interface configured to be detached by means of a laser debonding technique and/or chemical attack and/or by means of mechanical stress.

The present disclosure also relates to a substrate for epitaxial growth of a monocrystalline layer of diamond material, the substrate comprising a monocrystalline seed layer of $SrTiO_3$ material on a carrier substrate of silicon material.

In advantageous embodiments, the monocrystalline seed layer of $SrTiO_3$ material is in the form of a plurality of tiles.

In advantageous embodiments, the carrier substrate of silicon material comprises a detachable interface configured to be detached by means of a laser debonding technique and/or chemical attack and/or by means of mechanical stress.

The present disclosure also relates to a process for producing a monocrystalline layer of iridium material comprising the transfer of a monocrystalline seed layer of $SrTiO_3$ material to a carrier substrate of silicon material followed by epitaxial growth of the monocrystalline layer of iridium material.

The present disclosure also relates to a substrate for epitaxial growth of a monocrystalline layer of iridium material, wherein the substrate comprises a monocrystalline seed layer of $SrTiO_3$ material on a carrier substrate of silicon material.

The present disclosure also relates to a process for producing a monocrystalline layer of diamond and/or iridium material comprising the transfer of a monocrystalline seed layer of yttria-stabilized zirconia (YSZ), $CeO_2$, MgO or $Al_2O_3$ material to a carrier substrate of silicon, sapphire, Ni or Cu material, followed by epitaxial growth of the monocrystalline layer of diamond and/or iridium material.

The present disclosure also relates to a process for producing a monocrystalline layer of diamond and/or iridium material comprising the transfer of a monocrystalline seed layer of $SrTiO_3$ material to a carrier substrate of silicon, sapphire, Ni or Cu material, followed by epitaxial growth of the monocrystalline layer of diamond and/or iridium material.

BRIEF DESCRIPTION OF THE DRAWINGS

Other features and advantages of the present disclosure will be better understood from reading the following detailed description with reference to the appended drawings, in which:

FIG. 3 illustrates a process for producing a monocrystalline layer of diamond material according to yet another embodiment of the present disclosure and a substrate for the epitaxial growth of such a monocrystalline layer of diamond material according to this other embodiment of the present disclosure;

FIG. 4 illustrates a process for producing a monocrystalline layer of diamond material according to yet another embodiment of the present disclosure and a substrate for the epitaxial growth of such a monocrystalline layer of diamond material according to this other embodiment of the present disclosure; and FIG. 5 illustrates a process for producing a monocrystalline layer of diamond material according to yet another embodiment of the present disclosure and a substrate for the epitaxial growth of such a monocrystalline layer of diamond material according to this other embodiment of the present disclosure.

To improve the readability of the figures, the various layers are not necessarily shown to scale.

DETAILED DESCRIPTION

Figure 1:
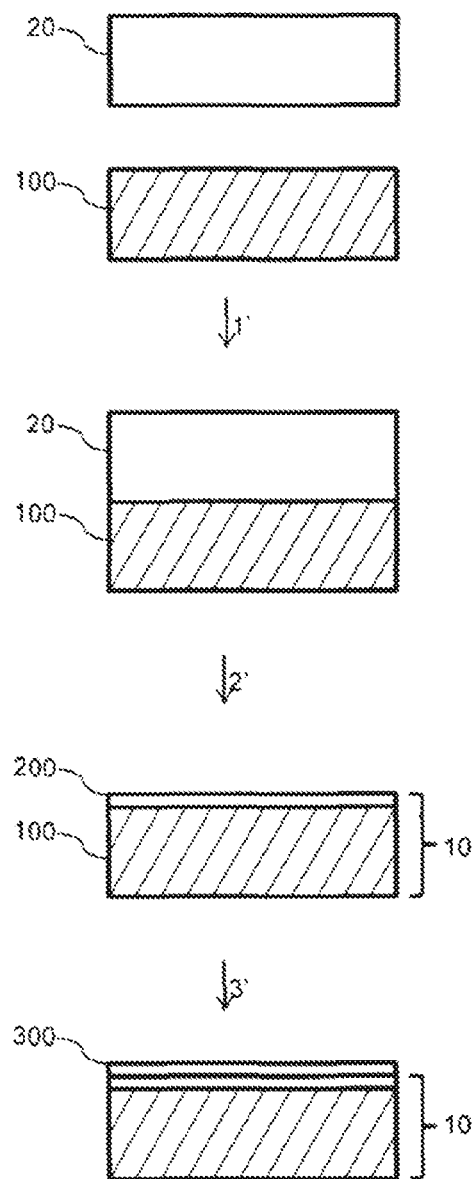
FIG. 1 illustrates a process for producing a monocrystalline layer of diamond material according to one embodiment of the present disclosure and a substrate for the epitaxial growth of such a monocrystalline layer of diamond material according to this embodiment of the present disclosure.

FIG. 1 illustrates a carrier substrate 100 of silicon material to which a monocrystalline seed layer 200 of $SrTiO_3$ material is transferred. Other materials for the monocrystalline seed layer 200 may be envisaged such as YSZ, $CeO_2$, MgO or $Al_2O_3$, these having a lattice parameter close to that of the PZT material. The carrier substrate 100 of silicon material may also be replaced with a carrier substrate 100 of sapphire, Ni or Cu material. The use of silicon has the advantage of opening up the field of application of films of diamond material not only for 300 mm-type large-scale equipment, but also making it compatible with the microelectronics industry, for which the requirements in terms of acceptance on the production line for exotic material other than silicon, especially diamond, are high. The step of joining 1' the monocrystalline seed layer 200 of $SrTiO_3$ material to the carrier substrate 100 of silicon material is preferably carried out by way of a molecular adhesion step. This molecular adhesion step comprises a bonding step, preferably at ambient temperature, and is followed by an anneal for consolidating the bonding interface, which is usually carried out at high temperatures of up to 900° C. or even 1100° C. for a duration of a few minutes to a few hours. Regarding a carrier substrate of sapphire material, the step of joining 1' the monocrystalline seed layer to the carrier substrate is also preferably carried out by way of a molecular adhesion step using typical conditions of the same order of magnitude as mentioned above. Regarding a carrier substrate of Ni or Cu material, the step of joining 1' the monocrystalline seed layer to the carrier substrate is replaced by a step of depositing the Ni or Cu material on the monocrystalline seed layer, for example, via deposition by electrodeposition (ECD) or electroforming (electroplating). This technique usually includes the use of a tie layer and stripping and is known per se and will not be described in more detail here.

FIG. 1 schematically shows the step of joining 1' a monocrystalline substrate 20 of $SrTiO_3$ material to the carrier substrate 100 of silicon material. It follows that a step of thinning 2' the monocrystalline substrate 20 of $SrTiO_3$ material after having been joined to the carrier substrate 100 of silicon material. FIG. 1 schematically shows the thinning step 2', which may be implemented, for example, by means of chemical and/or mechanical etching (polishing, grinding, milling, etc.). Thus, the monocrystalline seed layer 200 of $SrTiO_3$ material may be obtained, which will serve as the monocrystalline seed for a step of epitaxially growing 3' the monocrystalline layer 300 of diamond material on the substrate for epitaxial growth of a monocrystalline layer of diamond material 10 shown schematically in FIG. 1. Those skilled in the art would be capable of adjusting the parameters used for epitaxially growing a monocrystalline layer of diamond material usually used in homoepitaxy or heteroepitaxy on a bulk monocrystalline substrate in order to optimize the step of epitaxially growing 3' the monocrystalline layer 300 of diamond material on the substrate for epitaxial growth of a monocrystalline layer of diamond material 10 of the present disclosure. Epitaxy of the diamond material therefore takes place by way of epitaxy of a thin layer of about 150 nm of iridium via the electron beam physical vapor deposition technique followed by growth by way of MWCVD under a $CH_4/H_2$ atmosphere at typical temperatures of about 700° C.

It should be noted that the thermal expansion coefficient of the carrier substrate 100 dominates the thermal behavior of the substrate for epitaxial growth of a monocrystalline layer of diamond material 10 during the step of epitaxially growing 3' the monocrystalline layer 300 of diamond material. This is due to the low thickness, preferably less than 1 μm, of the monocrystalline seed layer 200 of $SrTiO_3$ material relative to the total thickness of the substrate for epitaxial growth of a monocrystalline layer of diamond material 10, which is of the order of several tens to hundreds of μm. Incidentally, the $SrTiO_3$ material is chosen so as to provide a monocrystalline seed layer having a lattice parameter that is as close as possible to the lattice parameter chosen for the monocrystalline layer 300 of diamond material, preferably the lattice parameter in the relaxed state in order to allow epitaxial growth resulting in as few defects as possible in the monocrystalline layer 300 of diamond material. Incidentally, the material of the carrier substrate 100 advantageously has a thermal expansion coefficient, which is particularly close to the thermal expansion coefficient of the diamond material for the same reasons of decreasing defects in the monocrystalline layer 300 obtained by epitaxy. Preferably, a carrier substrate 100 of silicon material would therefore be used for the present disclosure.

Figure 2:
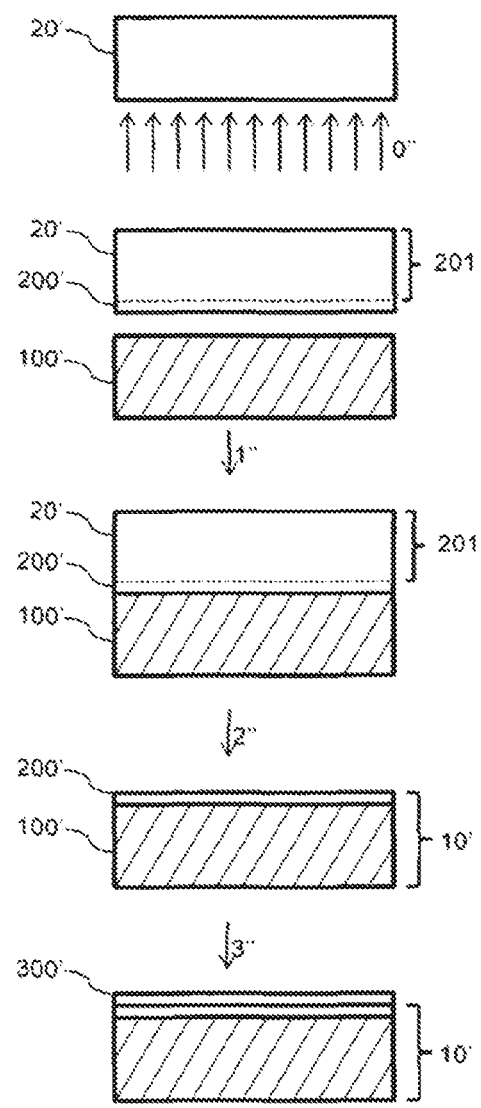
FIG. 2 illustrates a process for producing a monocrystalline layer of diamond material according to another embodiment of the present disclosure and a substrate for the epitaxial growth of such a monocrystalline layer of diamond material according to this other embodiment of the present disclosure.

FIG. 2 schematically shows one embodiment of the process for producing a monocrystalline layer of diamond material, which differs from the embodiment described in conjunction with FIG. 1 in that the monocrystalline substrate 20' of $SrTiO_3$ material undergoes a step of implanting 0" atomic and/or ionic species in order to form a weakened zone delimiting a portion 200' of the monocrystalline substrate 20' of $SrTiO_3$ material intended to be transferred to the carrier substrate 100' of silicon material, and in that the thinning step 2" comprises detaching at this weakened zone so as to transfer the portion 200' of the monocrystalline substrate 20' of $SrTiO_3$ material to the carrier substrate 100' of silicon material, in particular this detaching comprises the application of a thermal and/or mechanical stress. The advantage of this embodiment is thus to be able to recover the remaining part 201 of the starting monocrystalline substrate 20' of $SrTiO_3$ material, which may thus be used again to undergo the same process again and thus decrease costs. The substrate for epitaxial growth of a monocrystalline layer of diamond material 10' thus illustrated in FIG. 2 is used for the step of growing 3" the monocrystalline layer 300' of diamond material as already described in the process described in conjunction with FIG. 1. In general, the implantation step 0''' takes place using hydrogen ions. One advantageous alternative well known to those skilled in the art consists in replacing all or some of the hydrogen ions with helium ions. A hydrogen implantation dose will typically be between $6 \times 10^{16}$ cm$^{-2}$ and $1 \times 10^{17}$ cm$^{-2}$. The implantation energy will typically be between 50 to 170 keV. Thus, the detaching typically takes place at temperatures of between 300 and 600° C. Thicknesses of the monocrystalline seed layer of the order of 200 nm to 1.5 µm are thus obtained. Immediately after the detaching operation, additional technological steps are advantageously added with the aim of either strengthening the bonding interface or of restoring a good level of roughness, or of correcting any defects, which may have been generated in the implantation step or else to prepare the surface of the seed layer for the resumption of epitaxy. These steps are, for example, polishing, (wet or dry) chemical etching, annealing, chemical cleaning. They may be used alone or in a combination, which those skilled in the art will be capable of adjusting.

FIG. 3 differs from the embodiments described in conjunction with FIG. 1 and FIG. 2 in that the substrate for epitaxial growth of a monocrystalline layer of diamond material (10, 10') comprises a detachable interface 40' that is configured to be detached. In the case of a carrier substrate 100 of silicon material, it may be a rough surface, for example, of silicon material, joined with the monocrystalline seed layer during the joining step. Else, a rough interface may be present within the carrier substrate 100 of silicon material, the latter, for example, obtained by joining two silicon wafers. Another embodiment would be to introduce, at the face to be joined with the monocrystalline seed layer, a porous silicon layer that is liable to split during the application of a mechanical and/or thermal stress, for example, by inserting a blade at the edge of the wafer known to those skilled in the art or by applying an anneal. Obviously, this interface is chosen so as to withstand the other mechanical and/or thermal stresses experienced during the process of the present disclosure (e.g., detaching, epitaxial growth, etc.). In the case of a carrier substrate of sapphire material, it may be a stack of silicon oxide, silicon nitride and silicon oxide (what is called an ONO-type structure) produced on the face of the sapphire to be joined with the monocrystalline seed layer. Such a stack is liable to undergo detachment at the silicon nitride layer when applying a laser that passes through the sapphire carrier substrate (detaching or debonding of the "laser lift-off" type). Those skilled in the art will be capable of identifying other processes for producing this detachable interface. These various detaching configurations thus make it possible either to transfer the epitaxial layer to a final carrier, which is not compatible with the growth parameters or to prepare a thick film of diamond material of freestanding type.

FIG. 4 schematically shows one embodiment of the process for producing a monocrystalline layer of diamond material, which differs from the embodiments described in conjunction with FIGS. 1-3, wherein the monocrystalline seed layer 2000' of SrTiO$_3$ material is in the form of a plurality of tiles (2001', 2002', 2003') each transferred to the carrier substrate 100'' of silicon material. The various tiles may take any shape (square, hexagonal, strips, etc.) and have different sizes varying from a few mm$^2$ to several cm$^2$. The spacing between the chips may also vary significantly depending on whether what is sought is a maximum density of coverage (in this case a spacing of less than 0.2 mm will preferably be chosen) or conversely a maximum spread of the tiles within the substrate (in this case the spacing may be several millimeters and even centimeters). For each tile, a person skilled in the art would be capable of applying their desired transfer and they are not limited to a particular process. Thus, it is possible to envisage applying the technical teachings described in conjunction with the process illustrated schematically in FIG. 1 or the technical teachings described in conjunction with the process illustrated schematically in FIG. 2, or even a combination of the two. Thus, it is possible to join 1''' monocrystalline substrates (2001, 2002, 2003) of SrTiO$_3$ material, which have a size smaller than the size of the carrier substrate 100'' in order to create by thinning 2''' on this latter the monocrystalline seed layers (2001', 2002', 2003') for the epitaxial growth 3''' of a monocrystalline layer (3001, 3002, 3003) of diamond material on each tile of the substrate for epitaxial growth of a monocrystalline layer of diamond material 10'''.

The various embodiments described in conjunction with FIGS. 1 to 4 thus open up the possibility of co-integration of components made in the monocrystalline layer of diamond material with components made in the carrier substrate of silicon material. This latter may simply be a silicon substrate, but it may also be an SOI-type substrate comprising a silicon oxide layer separating a silicon substrate from a thin silicon layer. In the case of the embodiments described in conjunction with FIGS. 1 to 4, access to the carrier substrate may be achieved simply by way of lithography and etching known to those skilled in the art. In the case of the embodiment described in conjunction with FIG. 4, it is also possible just to choose the locations of the tiles and their spacing.

FIG. 5 schematically shows one embodiment, which differs from the embodiment described in conjunction with FIG. 4 in that the carrier substrate 100'' and subsequently the substrate for epitaxial growth of a monocrystalline layer of diamond material 10'' comprises a detachable interface 40 that is configured to be detached, for example, by a laser debonding (laser lift-off) technique and/or chemical attack and/or by application of mechanical stress. This would allow part of the carrier substrate 100'' to be removed as already mentioned in conjunction with FIG. 3. One example would be the use of a carrier substrate 100 of SOI type comprising a silicon oxide layer separating a silicon substrate from a thin silicon layer. This oxide layer could be used as a detachable interface 40 by selective etching this oxide layer, for example, by immersion in a hydrofluoric (HF) acid bath. This option of detaching a buried layer by means of chemical etch is particularly advantageous when it is in combination with treating a plurality of small substrates. Specifically, the range of under-etches is generally limited to a few centimeters or even a few millimeters if it is desired to retain industrially reasonable treatment conditions and times. Treating a plurality of small substrates allows the initiation of several chemical etching fronts by virtue of possible access to the buried layer between each tile, rather than just at the extreme edges of the substrates, which may be up to 300 mm in diameter. In the case of an SOI-type carrier substrate, it is thus possible to partially remove the thin layer of silicon between the tiles in order to allow the initiation of several etching fronts.

Since the thin layer of silicon has a predetermined thickness (which may vary between 5 nm to 600 nm, or even thicker depending on the intended application), it could thus be used to form microelectronic components and thus allow the co-integration of components based on diamond materials in a single substrate.

Thus, after having formed the monocrystalline layer (3001, 3002, 3003) by epitaxy, it is also possible to conceive joining this structure to a final substrate and detaching, at the detachable interface 40, a part of the carrier substrate 100". The final substrate may thus provide additional functionalities, which are, for example, incompatible with parameters of the growth carried out previously (for example, final substrate of flexible plastic type or final substrate comprising metal lines). Additionally and in general, the detachable interface is not necessarily located inside the carrier substrate but may also be located at the interface with the seed layer of $SrTiO_3$ material joined to this carrier substrate (for example, a stack of a layer of silicon nitride between two layers of silicon oxide allows laser debonding, particularly suitable for a carrier substrate of sapphire type) as already described in conjunction with FIG. 3.

The invention claimed is:

1. A process for producing a monocrystalline layer of diamond material, comprising transferring a monocrystalline seed layer of $SrTiO_3$ material to a carrier substrate of silicon material followed by epitaxial growth of the monocrystalline layer of diamond material.

2. The process of claim 1, wherein the monocrystalline seed layer has a thickness of less than 10 μm, preferably less than 2 μm, and more preferably less than 0.2 μm.

3. The process of claim 1, wherein the transfer of the monocrystalline seed layer of $SrTiO_3$ material to the carrier substrate of silicon material comprises joining a monocrystalline substrate of $SrTiO_3$ material to the carrier substrate followed by thinning the monocrystalline substrate of $SrTiO_3$ material.

4. The process of claim 3, wherein the thinning of the monocrystalline substrate of $SrTiO_3$ material comprises forming a weakened zone delimiting a portion of the monocrystalline substrate of $SrTiO_3$ material to be transferred to the carrier substrate of silicon material.

5. The process of claim 4, wherein forming the weakened zone comprises implanting atomic and/or ionic species into the monocrystalline substrate of $SrTiO_3$ material.

6. The process of claim 5, wherein the thinning of the monocrystalline substrate of $SrTiO_3$ material comprises detaching the monocrystalline substrate of $SrTiO_3$ material at the weakened zone so as to transfer the portion of the monocrystalline substrate of $SrTiO_3$ material to the carrier substrate of silicon material.

7. The process of claim 3, wherein joining the monocrystalline substrate of $SrTiO_3$ material to the carrier substrate comprises molecular adhesion of the monocrystalline substrate of $SrTiO_3$ material to the carrier substrate.

8. The process of claim 1, wherein the monocrystalline seed layer of $SrTiO_3$ material is in the form of a plurality of tiles each transferred to the carrier substrate of silicon material.

9. The process of claim 1, wherein the carrier substrate of silicon material comprises a detachable interface configured to be detached by a laser debonding technique and/or chemical attack and/or by application of mechanical stress.

10. A substrate for epitaxial growth of a monocrystalline layer of diamond material, comprising a monocrystalline seed layer of $SrTiO_3$ material in the form of a plurality of tiles on a carrier substrate of silicon material.

11. The substrate of claim 10, wherein the carrier substrate of silicon material includes a detachable interface configured to be detached by a laser debonding technique and/or chemical attack and/or by application of mechanical stress.

12. A process for producing a monocrystalline layer of iridium material, comprising transferring a monocrystalline seed layer of $SrTiO_3$ material to a carrier substrate of silicon material followed by epitaxial growth of the monocrystalline layer of iridium material.

13. A substrate for epitaxial growth of a monocrystalline layer of iridium material, comprising a monocrystalline seed layer of $SrTiO_3$ material in the form of a plurality of tiles on a carrier substrate of silicon material.

14. A process for producing a monocrystalline layer of diamond and/or iridium material, comprising transferring a monocrystalline seed layer of yttria-stabilized zirconia (YSZ), $CeO_2$, MgO or $Al_2O_3$ material to a carrier substrate of silicon, sapphire, Ni or Cu material, followed by epitaxial growth of the monocrystalline layer of diamond and/or iridium material.

15. A process for producing a monocrystalline layer of diamond and/or iridium material, comprising transferring a monocrystalline seed layer of $SrTiO_3$ material to a carrier substrate of silicon, sapphire, Ni or Cu material, followed by epitaxial growth of the monocrystalline layer of diamond and/or iridium material.

16. The process of claim 2, wherein the monocrystalline seed layer has a thickness of less than 2 μm.

17. The process of claim 2, wherein the monocrystalline seed layer has a thickness of less than 0.2 μm.

18. The process of claim 6, wherein detaching at the weakened zone comprises application of a thermal and/or mechanical stress to the monocrystalline substrate of $SrTiO_3$ material.

* * * * *

UNITED STATES PATENT AND TRADEMARK OFFICE
CERTIFICATE OF CORRECTION

PATENT NO. : 11,935,743 B2
APPLICATION NO. : 17/042728
DATED : March 19, 2024
INVENTOR(S) : Bruno Ghyselen Page 1 of 1

It is certified that error appears in the above-identified patent and that said Letters Patent is hereby corrected as shown below:

In the Specification

Column 1, Line 12, change "PCT/IB32019/" to --PCT/IB2019/--

Signed and Sealed this
Twenty-first Day of May, 2024

Katherine Kelly Vidal
Director of the United States Patent and Trademark Office